United States Patent
Long et al.

(10) Patent No.: US 10,501,847 B2
(45) Date of Patent: Dec. 10, 2019

(54) APPARATUS AND METHOD FOR GENERATING A VAPOR FOR A CVD OR PVD DEVICE

(71) Applicant: AIXTRON SE, Herzogenrath (DE)

(72) Inventors: Michael Long, Herzogenrath-Kohlscheid (DE); Birgit Irmgard Beccard, Aachen (DE); Claudia Cremer, Jülich (DE); Karl-Heinz Trimborn, Wegberg (DE); Andy Eichler, Aachen (DE); Andreas Poqué, Aachen (DE)

(73) Assignee: AIXTRON SE, Herzogenrath (DE)

( * ) Notice: Subject to any disclaimer, the term of this patent is extended or adjusted under 35 U.S.C. 154(b) by 286 days.

(21) Appl. No.: 15/316,646

(22) PCT Filed: Jun. 17, 2015

(86) PCT No.: PCT/EP2015/063530
§ 371 (c)(1),
(2) Date: Dec. 6, 2016

(87) PCT Pub. No.: WO2016/000958
PCT Pub. Date: Jan. 7, 2016

(65) Prior Publication Data
US 2018/0148836 A1    May 31, 2018

(30) Foreign Application Priority Data
Jul. 1, 2014   (DE) .................. 10 2014 109 194

(51) Int. Cl.
*C23C 16/448*    (2006.01)
*C23C 14/12*    (2006.01)
(Continued)

(52) U.S. Cl.
CPC .......... *C23C 16/4483* (2013.01); *C23C 14/12* (2013.01); *C23C 14/246* (2013.01);
(Continued)

(58) Field of Classification Search
None
See application file for complete search history.

(56) References Cited

U.S. PATENT DOCUMENTS 2,447,789 A * 8/1948 Barr ...................... C23C 14/243
                                                    118/726
4,769,292 A * 9/1988 Tang .................... H01L 51/0064
                                                    313/504
(Continued)

FOREIGN PATENT DOCUMENTS

DE   10 2011 051 260 A1   12/2012
DE   10 2011 051 261 A1   12/2012
(Continued)

OTHER PUBLICATIONS

International Search Report dated Oct. 14, 2015, from the European Patent Office, for International Patent Application No. PCT/EP2015/063530 (filed Jun. 17, 2015), 7 pgs.
(Continued)

*Primary Examiner* — Thor S Campbell
(74) *Attorney, Agent, or Firm* — Ascenda Law Group, PC

(57) ABSTRACT

In a device and a method for generating vapor in a CVD or PVD device, particles are vaporized by bringing the particles into contact with a first heat transfer surface of a vaporization device. The vapor generated by vaporizing the particles is transported by a carrier gas out of the vaporization device and into a single or multistage modulation device. In a vapor transfer phase, second heat transfer surfaces of the modulation device are adjusted to a first modulation temperature, at which the vapor passes through the modulation device
(Continued)

without condensing on the second heat transfer surfaces. At an intermission phase, the second heat transfer surfaces are adjusted to a second modulation temperature, at which at least some of the vapor condenses on the second heat transfer surfaces.

14 Claims, 3 Drawing Sheets

(51) Int. Cl.

| | | |
|---|---|---|
| *C23C 14/24* | (2006.01) | |
| *C23C 14/26* | (2006.01) | |
| *C23C 14/54* | (2006.01) | |
| *C23C 16/52* | (2006.01) | |
| *F22D 1/00* | (2006.01) | |

(52) U.S. Cl.
CPC .............. *C23C 14/26* (2013.01); *C23C 14/54* (2013.01); *C23C 16/4486* (2013.01); *C23C 16/4487* (2013.01); *C23C 16/52* (2013.01); *F22D 1/003* (2013.01)

(56) References Cited

U.S. PATENT DOCUMENTS

| | | | | |
|---|---|---|---|---|
| 4,885,211 A | * | 12/1989 | Tang | ...................... C09K 11/06 428/457 |
| 4,981,102 A | * | 1/1991 | Gautreaux | ............ C23C 16/455 118/725 |
| RE34,806 E | * | 12/1994 | Cann | ..................... C23C 16/513 118/723 DC |
| 9,190,299 B2 | * | 11/2015 | Wada | ................ H01L 21/02238 |
| 2003/0026601 A1 | | 2/2003 | Jabbour | |
| 2006/0115585 A1 | | 6/2006 | Bulovic et al. | |
| 2011/0268870 A1 | * | 11/2011 | Ohmi | ..................... C23C 14/12 427/66 |

FOREIGN PATENT DOCUMENTS

| | | |
|---|---|---|
| WO | 2012/175124 A1 | 12/2012 |
| WO | 2012/175126 A1 | 12/2012 |
| WO | 2012/175128 A1 | 12/2012 |

OTHER PUBLICATIONS

Written Opinion dated Jun. 17, 2015, from the European Patent Office, for International Patent Application No. PCT/EP2015/063530 (filed Jun. 17, 2015), 7 pgs.

International Preliminary Report on Patentability dated Jan. 3, 2017, from the International Bureau of WIPO, for International Patent Application No. PCT/EP2015/063530 (filed Jun. 17, 2015), 8 pages.

International Preliminary Report on Patentability dated Jan. 3, 2017, from the International Bureau of WIPO, for International Patent Application No. PCT/EP2015/063530 (filed Jun. 17, 2015), English Translation, 9 pages.

Written Opinion dated Oct. 14, 2015, from the ISA, European Patent Office, for International Patent Application No. PCT/EP2015/063530 (filed Jun. 17, 2015), English Translation, 8 pages.

* cited by examiner

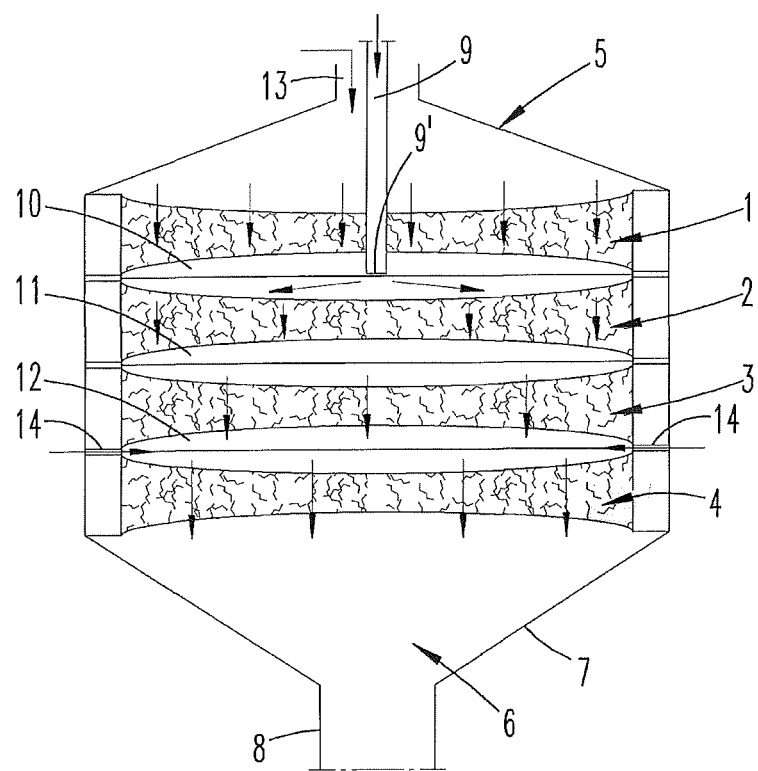

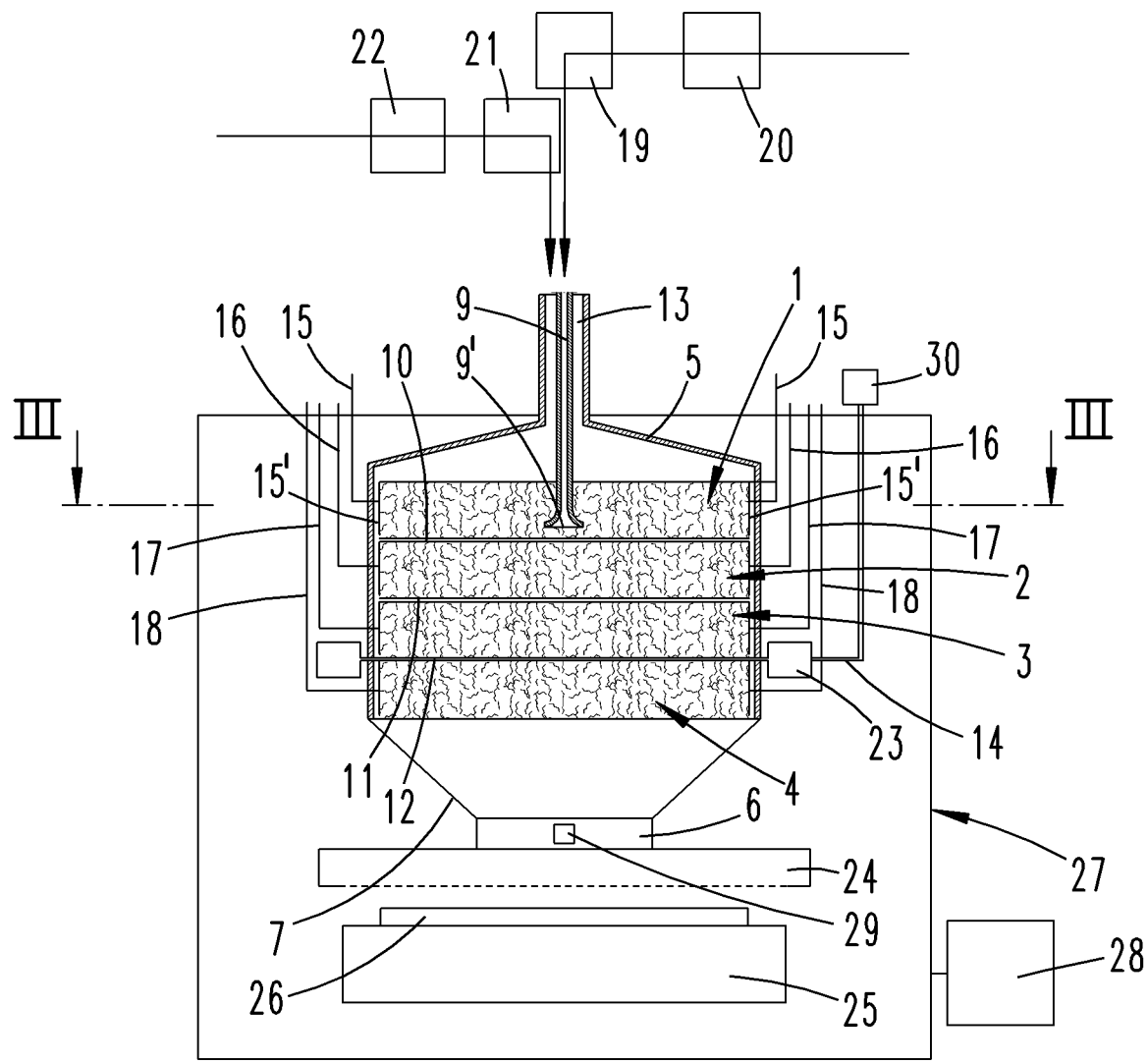

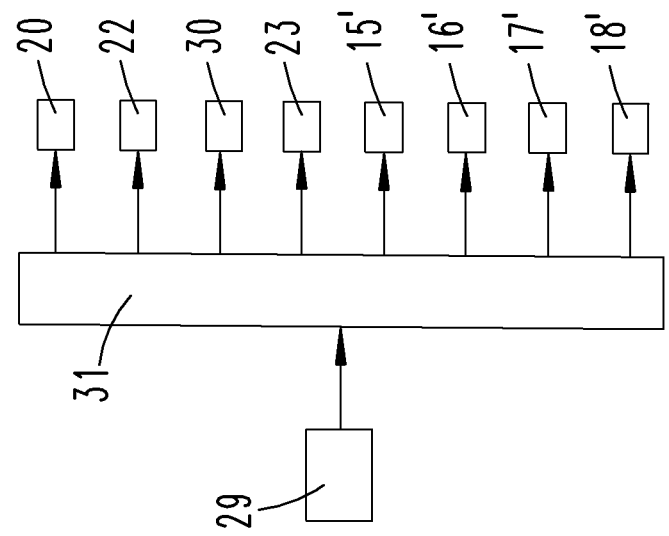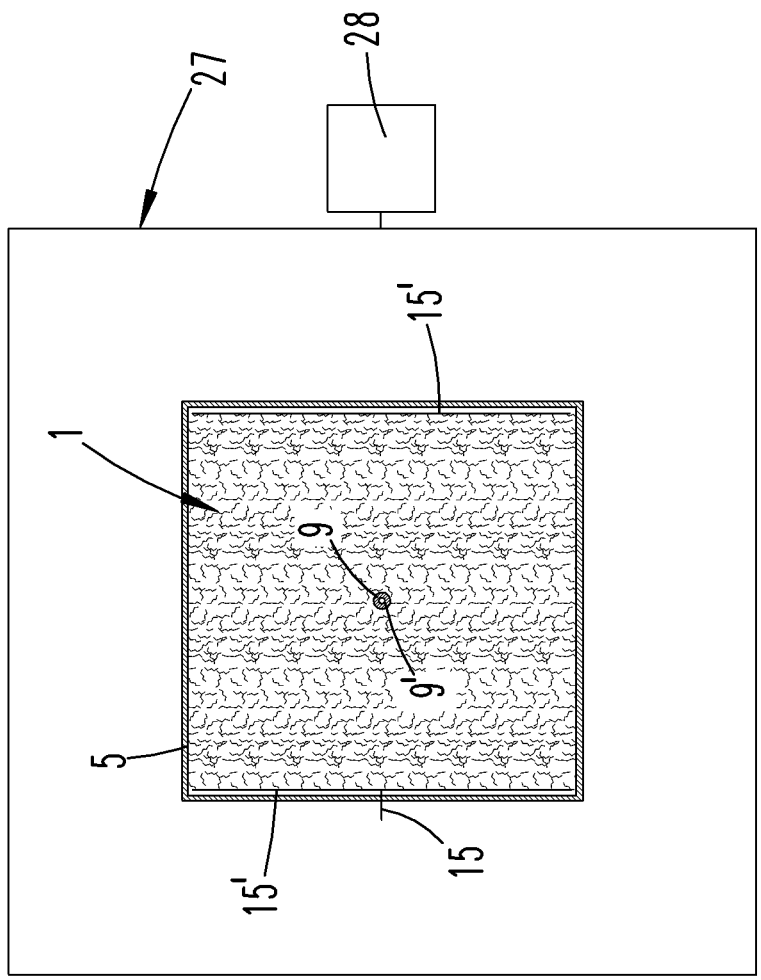

APPARATUS AND METHOD FOR GENERATING A VAPOR FOR A CVD OR PVD DEVICE

RELATED APPLICATIONS

This application is a National Stage under 35 USC 371 of and claims priority to International Application No. PCT/EP2015/063530, filed 17 Jun. 2015, which claims the priority benefit of DE Application No. 10 2014 109 194.9, filed 1 Jul. 2014.

FIELD OF THE INVENTION

The invention relates to a method for generating a vapor in a CVD or PVD device, in which the heat of vaporization is transferred to solid or liquid particles by bringing the particles into contact with a first heat transfer surface, which has reached a vaporization temperature, of a single or multistage vaporization device and the vapor generated by vaporization of the particles is transported out of the vaporization device by a carrier gas in a flow direction of the carrier gas.

The invention further relates to a device for generating a vapor for a CVD or PVD device, in particular for carrying out the method, having a vaporization device, which has a first heat transfer surface that can be heated up to a vaporization temperature for transferring vaporization heat to solid or liquid particles placed in the vaporization device, wherein the vapor generated by vaporization of the particles by a carrier gas is transported out of the vaporization device by a carrier gas in a flow direction of the carrier gas.

BACKGROUND

A device for providing a vapor, comprising one or more finely porous foam bodies which are brought to a vaporization temperature by passing an electrical current through them, is disclosed in WO 2012/175124, DE 10 2011 051 261 A1 or DE 10 2011 051 260 A1. These documents state, inter alia, that due to the non-uniform particle size it is advantageous to thinly coat the cell walls of an open porous foam body with the aerosol, so that due to heat supplied through the coated cell walls, the coating can be uniformly evaporated.

WO 2012/175128 or WO 2012/175126 describe a vaporization device and a vaporization method in which a vapor is brought into a multi-stage temperature control device. In the upstream temperature control stage the vapor, or the carrier gas carrying the vapor, is heated to a homogeneous temperature. This takes place in an open porous foam body which is heated up to such a temperature that the vapor does not condense on the cell walls of the foam body. A second porous foam body arranged downstream has a lower temperature, so that the vapor can condense there on the cell surfaces. The downstream temperature regulation stage is held at a temperature at which condensation and evaporation are in equilibrium, so that averaged over time no accumulation of a non-gaseous substance is formed on the cell walls.

SUMMARY OF THE INVENTION

In a coating process or in a coating device, it is desirable to abruptly switch on or switch off the reaction gases, which are provided in particular by vaporization of an aerosol. In practice, this is achieved by means of valves which redirect the process gas flow transported in a carrier gas into a bypass pipe, which allows the process gas flow to flow past the processing chamber. By switching over, the process gas flow stabilized in the vent operation can be directed into the processing chamber. When such a switching operation is performed, the total flow of the gas flowing in the processing chamber will change, so that the process gas flow only stabilizes after a transient phase. The diversion of the process gas past the processing chamber also gives rise to an unwanted material loss. The substances used are expensive organic, in particular high-purity substances, which for reasons of cost must be used with the maximum possible efficiency.

The organic particles vaporize at a vaporization temperature and during their transport in a carrier gas they must be kept at a temperature which prevents condensation. To this end, the walls of the transport pipes are heated. It is also technically problematic that under virtual vacuum conditions, the aerosol has a relatively low thermal capacity, so that the supply of sufficiently high vaporization heat requires a correspondingly high temperature gradient. On the other hand, the organic particles have only a limited chemical stability. At temperatures above the vaporization temperature, they can chemically decompose. The field of application of the invention is both physical gas-phase vapor deposition and chemical gas-phase vapor deposition.

The object of the invention is to extend a generic method or a generic device in a manner which provides advantages in use.

The object is achieved by the invention specified in the claims.

First of all, a modulation device is essentially proposed. The modulation device is arranged in the flow direction behind the vaporization device and can be single-stage or multi-stage. The single-stage or multi-stage vaporization device, which can be designed from a solid foam as is described in the above-mentioned prior art, is heated up to a vaporization temperature. A preferably pre-heated carrier gas is fed into the porous body forming the first heat transfer surfaces. In this porous body an aerosol is also fed, which comprises liquid or solid particles. The particles come into contact with the heat transfer surfaces which have been heated to a vaporization temperature. The heat transfer surfaces are the cell walls of a porous foam. The method is preferably carried out at a pressure at which the free path length of the particles in the carrier gas is only slightly smaller than the pore size of the solid foam which forms the vaporization surfaces. The pressure can be a few millibars. When the particles come into contact with the vaporization surfaces, vaporization heat is supplied to the particles so that they are vaporized. The vapor is transported out from the vaporization device by the carrier gas and enters a modulation device. The modulation device has at least one element which comprises second heat transfer surfaces. Preferred extensions of the invention are described hereafter: the one or more elements of the modulation device are designed identical to one or more elements of the vaporization device. There can be multiple vaporization stages for different types of source materials, which are each supplied in aerosol form to a vaporization body, arranged one after the other. As a consequence, vapor generated in an upstream vaporization body passes through a downstream vaporization body of a second vaporization stage. A mixture of a plurality of vapors can then escape from the last heat transfer medium. In all cases, electrically conductive solid foams are preferably used. At least one element of the modulation device can not only be kept constant at the vaporization temperature, so that vapor and carrier gas can pass freely out of the modulation device. In accordance with the invention it is provided that at least one element of the modulation device can be cooled to a condensation temperature of the vapor. If a plurality of vapors with different vaporization temperatures are generated, then the modulation device can be cooled to a condensation temperature at which the vapor with the lowest vaporization temperature also condenses. The condensation temperature can be 20° C. lower than the vaporization temperature. For example, the vaporization temperature can be 350° C. The modulation device can then be cooled from 350° C. to 330° C., at least in some regions. At this temperature, at least the majority of the vapor transported from the vaporization device into the modulation device condenses in the modulation device, so that preferably only the carrier gas passes through the modulation device unhindered, but the vapor is condensed out completely, or at least almost completely, from the carrier gas. The vapor condenses on the heat transfer surfaces of the modulation device, i.e. on the cell walls of the open-cell solid foam. In the vapor transfer phase, averaged over time, no material accumulation takes place on the heat transfer surfaces. Any condensation of the vapor on the heat transfer surfaces is in thermodynamic equilibrium with a re-vaporization, so that on average, vapor and carrier gas pass freely through the modulation device unhindered. If the modulation temperature is lowered, then averaged over time a material accumulation takes place on the second heat transfer surfaces due to condensation. The modulation device and the vaporization device are preferably located in a housing, wherein the walls of the housing are heated to a temperature greater than or equal to the temperature at which the particles vaporize. This ensures that in the vapor transfer phase, in which the device supplies a vapor which is fed to a gas inlet body of a CVD or PVD reactor, no condensation takes place on the walls. In an intermission phase, in which the gas inlet body of the CVD or PVD reactor is not intended to be supplied with vapor, at least one element of the modulation device will be cooled to a temperature at which the vapor condenses out of the carrier gas. This is preferably achieved by introducing a coolant, wherein it is provided that the coolant is a cooling gas which is fed into the carrier gas stream. For this purpose, a cooling gas pipe can protrude into the space between two elements of the modulation device. The cooling gas, which is thereby fed into the intermediate space, cools both the downstream section of an upstream element of the modulation device and an upstream section of the downstream element of the modulation device to a temperature which gives rise to a deposition of the vapor on the cell walls. During the intermission phase, an aerosol is also fed into the vaporization device. The vaporization device can contain a plurality of elements, wherein an upstream element in the form of an open-pored foam body is used only for heating the carrier gas. The aerosol is fed into a space between the two elements arranged downstream in the flow direction. An aerosol supply pipe which feeds into the intermediate space is used for this. Due to back-diffusion of the aerosol however, the vaporization takes place not only in the downstream element of the vaporization device but also in the downstream section of the upstream element of the vaporization device. The apparatus has a regulating device. The regulating device is connected to a sensor, which is arranged downstream of the modulation device and is capable of determining the concentration or partial pressure of the vapor in the carrier gas. The regulating device provides control signals to the heating device of the modulation device and to a mass flow controller, with which the cooling gas flow can be adjusted.

By variation of the heating power of the modulation device, but in particular by variation of the cooling gas flow, the function of the modulation device can be switched between vapor-permeable to vapor-blocking. By means of the regulating device however, the temperature of the modulation device can also be precisely adjusted, such that any condensate formed on the second heat transfer surfaces during a vapor transfer phase evaporates away. By a moderate dosage of the cooling gas the vaporization temperature can be adjusted so that the evaporator supplies a constant vapor rate. The vaporization device enables a coarse delivery rate for the vapor to be set. The modulation device can be used to precisely control the vapor supply rate, wherein the modulation device can be adjusted continuously between the completely vapor-permeable state and the completely vapor-impermeable state. It is regarded as advantageous that with the apparatus according to the invention or the method according to the invention respectively, the vapor supply device can be switched between two operating states either abruptly or continuously. There is no need to use mechanical valves, the switching accuracy and leakage of which cause problems at the temperatures above 250° C. as used here. An efficient utilization of the organic source materials is possible because it is not necessary to direct a vapor past a processing chamber if it does not contain any substrates. In the event of a stoppage of growth, the aerosol supply into the evaporator does not need to be interrupted for at least approximately 30 minutes. During this time, due to condensation of the vaporized particles a storage mass builds up in the modulation device, which if substrates are present in the process chamber, can later be discharged again for coating the substrates. The gas, or gas-vapor mixture, flowing through the temperature-adjusted solid foams of the vaporization device and the modulation device is adjusted to a homogeneous temperature, so that even at low total pressures the vapor is effectively prevented from condensing out on sections of the piping surface. In accordance with the invention, the vapor transfer can be turned off and on again without affecting the carrier gas stream. A cooling gas stream which is fed into the modulation device can be compensated by a corresponding reduction in a hot gas flow, which is otherwise fed in at the same point. The individual elements of the modulation device or the vaporization device can have a material thickness of approximately 1 cm. They are capable of being heated up to 350° C. at a total pressure of one millibar. The opening area of the solid foam is preferably 97%, wherein the pore size is approximately 250 μm (100 pores per inch). Nitrogen, which is used as the carrier gas, has a kinetic diameter of about 3.16 Å, and at the pressure of 1 mbar and temperature of 350° C. used here, a mean free path length of approximately 61 μm. A material $AlQ_3(C_{27}H_{18}AlN_3O_3)$ used for the OLED deposition process has a kinetic diameter of about 11.4 Å, and at 350° C. and pressure of 1 mbar has a mean free path length of 18 μm. The mean free path length of the molecules to be vaporized is sufficiently close to the pore size. There is therefore a sufficiently high probability that each molecule comes into contact with the cell wall at least once when passing through the solid foam. In addition, due to the collision of the particles/molecules with the nitrogen molecules, a heat transfer also occurs. The selected through passage or interruption of a vapor flow without significant resistance to the carrier gas through the modulation device opens up new processing options. Thus, the vapor feed rate can be abruptly turned off during a coating process when the desired coating thickness is obtained. No additional mechanical valves are used in the apparatus. Neither does the vapor need to be diverted into a bypass, as is the case in the prior art. Since only the vapor flow is interrupted, the other pressure conditions in the process chamber do not change. The constancy of the pressure is also advantageous for disposing of the waste gas downstream of the substrate which is being coated.

BRIEF DESCRIPTION OF THE DRAWINGS

Exemplary embodiments of the invention are explained below, by reference to the attached drawings. They show:

FIG. 1 schematic view of the section through an evaporator of a first exemplary embodiment, FIG. 2 the section through an evaporator of a second embodiment integrated in a coating system, FIG. 3 the section in accordance with the line III-III in FIG. 2, and FIG. 4 a schematic diagram of a device for regulating a stationary vapor flow.

DETAILED DESCRIPTION

The devices shown in FIGS. 1 and 2, for generating a vapor transported in a carrier gas for deposition of an OLED structure on a substrate, have a housing 5. The housing 5 has heated housing walls. In an inlet section of the housing 5, a carrier gas feed line 13 is located, through which a carrier gas, for example nitrogen, is introduced into the inlet section of the housing. The inlet section of the housing 5 widens out in a funnel-like manner. The housing then continues in a cylindrical form, with a total of four open-celled foam bodies consisting of graphite or similar suitable material being arranged one after the other in the flow direction, wherein each of the foam bodies 1, 2, 3, 4 fills the entire cross-section of the housing 5. The foam bodies can have a cross-sectional area of, for example, 36 cm$^2$ and a thickness of approx. 1 cm. They have a pore width of 250 μm (100 pores per inch), and an open cross-sectional area of about 97%. The solid foam of bodies 1, 2, 3, 4 is electrically conductive, so that the foam bodies can be heated by passage of an electrical current through them. In FIGS. 2 and 3, relevant supply lines 15, 16, 17, 18 and contacts 15' are indicated. At the contacts 15', 16', 17', 18', either a voltage regulated by a regulator 31 can be applied or a regulated current can be fed in.

Through an aerosol supply pipe 9, an aerosol consisting of a carrier gas, for example nitrogen, and for example AlQ$_3$ can be fed into an intermediate space 10 between a first foam body 1 and a second foam body 2. Between the second foam body 2 in the flow direction and the third foam body 3 in the flow direction, an intermediate space 11 is located.

Between the third foam body 3 in the flow direction and the fourth foam body 4 in the flow direction, another intermediate space 12 is also located. A cooling gas supply pipe 14 feeds into the intermediate space 12, through which a cooling gas can be fed which is either cooled but can also be at room temperature, where appropriate. The cooling gas can also be nitrogen.

The cylindrical section of the housing 5, which houses the four foam bodies 1 to 4 in the exemplary embodiment, is connected to an outlet section with a heated conical surface 7 and a heated cylindrical section 8. A carrier gas vapor mixture passes into the outlet channel 6 thus formed.

In the exemplary embodiment, four foam bodies are shown one behind the other. In the exemplary embodiment not shown, the number of foam bodies can be larger or smaller than this.

The essential components are a first foam body, with which an aerosol fed in through the aerosol supply pipe 9 is vaporized, and at least a second foam body, which is arranged behind the first foam body and which can be adjusted to a temperature that is lower than the vaporization temperature, so that the vapor can almost completely condense in the cell walls of the open-pored foam, so that only the carrier gas passes through the outlet channel 6.

In the case of the exemplary embodiment shown in FIGS. 1 and 2, the opening 9' of the aerosol supply pipe 9 protrudes into the intermediate space 10 between the foam body 1, which forms a pre-heating device for the carrier gas which is supplied through the carrier-gas supply pipe 13. The pre-heating device 1, which is heated to the vaporization temperature, can also cause vaporization of the aerosol however, which can diffuse upstream into the pre-heating unit 1 by back-diffusion. The substantial vaporization of the aerosol takes place in the second foam body in the flow direction, however, namely in the vaporization device 2. The gas which enters the intermediate space 11 between the foam body 2 and the foam body 3 is therefore a pure carrier-gas vapor mixture.

The foam bodies 3 and 4 form a modulation device. The modulation device 3, 4 can be heated up to a temperature which corresponds to the vaporization temperature. In this operating mode the device is working in a vapor transfer phase. The vapor and the carrier gas pass freely through the modulation device 3, 4.

A carrier gas, heated to vaporization temperature, can enter through the cooling gas supply pipe 14 in this operating mode. During the vapor transfer phase, however, preferably no gas at all enters the space between 12 between the two foam bodies 3, 4 of the modulation device through the cooling gas supply pipe 14.

In an intermission phase, a cooling gas is introduced into the intermediate space 12 through the cooling gas supply pipe 14. The two solid foams 3, 4 of the modulation device are not actively heated in this mode of operation. This has the consequence that the regions of the foam bodies 3, 4 adjoining the intermediate space 12 cool down by approximately 20°. In particular, the foam body 4 located downstream is cooled to a condensation temperature at which the vapor generated in the vaporization device 2 condenses on the cell walls of the foam body as a thin film. Due to the cooling of the modulation device 3, 4 to a condensation temperature, the vapor concentration in the carrier gas can therefore be reduced to zero in the outlet channel 6 without the total pressure or carrier gas flow being significantly affected. The cooling gas stream, which is fed into the total gas stream through the cooling gas supply pipe 14, can be compensated by means of a corresponding reduction in the carrier gas fed through the carrier gas supply pipe 13.

By reduction of the cooling gas stream, or by means of an appropriate temperature adjustment of modulation device 3, by passing an electrical current through it, the temperature of the modulation device can be raised above the condensation temperature, so that the film deposited on the cell walls of the modulation device can be vaporized in a controlled manner. This allows the vapor transfer rate of the apparatus to be precisely adjusted.

FIG. 2 additionally shows a schematic view of an aerosol generator 19 and a mass flow controller 20. The mass flow controller 20 is used to adjust a carrier gas stream which flows through the aerosol generator 19. Particles generated in the aerosol generator are therefore transported in the gas stream through the aerosol supply pipe 9 into the intermediate space 10.

By means of a heating device 21, a carrier gas flow adjusted by a mass flow controller 22 can be heated up. The heating device 21 is not necessary, however, if the pre-heating unit 1 is dimensioned large enough.

The reference number 23 is used to designate a temperature control device for the cooling gas 14. The temperature control device 23 is optional. The cooling gas 14 is also adjusted by means of a mass flow controller 30. The housing of the gas transfer device is arranged in a reactor housing 27 of a CVD reactor. Within the reactor housing 27 a shower head-like gas inlet body 24 is arranged, which is fed by a gas outlet channel 6 of the gas transfer device. In the gas outlet channel 6 a sensor 29 is arranged, which is capable of determining the concentration of the vapor within the carrier gas stream.

The gas outlet body 24, on the side thereof facing a substrate 26, has a plurality of gas discharge apertures, through which the carrier gas vapor mixture can flow out into a processing chamber, the bottom of which forms a susceptor 25 which is temperature-controlled. The susceptor 25 can, for example, be temperature-controlled in such a way that a layer of the vaporized organic material is deposited on the surface of the substrate 26 resting thereon.

By means of a vacuum pump 28, the total pressure within the processing chamber and within the vaporization device can be adjusted down to approximately 1 mbar.

The temperatures to which the pre-heating device 1, the vaporization device 2 or the modulation device 3, 4 are heated depend on the material to be vaporized. The temperatures are usually between 250 and 350° C.

FIG. 4 shows a schematic view of a control loop, with which by means of the sensor 29 and a regulator 31, the vapor generation rate can be adjusted to a constant specified value. For this purpose, the regulator 31 controls the mass flow of aerosol using the mass flow regulator 20, the mass flow of the carrier gas using the mass flow regulator 22, the mass flow of the cooling gas using the mass flow regulator 30, the temperature of the cooling gas using the temperature control device 23, and the heating power levels that are fed into the heatable foam bodies 1 to 4 by means of the electrical currents that are fed into the foam bodies 1, 2, 3, 4 through the contacts 15', 16', 17', 18'.

The above statements are given as an explanation of the inventions comprised by the application as a whole, which each independently extend the state of the art at least by the following combinations of features, namely:

a method which is characterized in that the vapor is transported by the carrier gas through a modulation device 3, 4 arranged after the vaporization device 1, 2 in the flow direction, which modulation device 3, 4 comprises second heat transfer surfaces which are adjusted to a first modulation temperature in a vapor transfer phase at which the vapor passes through the modulating device 3, 4 without condensing on the second heat transfer surfaces, and which are adjusted to a second modulation temperature in an intermission phase, at which at least a part of the vapor condenses on the second heat transfer surfaces.

a method which is characterized in that the modulation device 3, 4 is actively cooled to the second modulation temperature, in particular by introducing a cooling gas, wherein in particular it is provided that the cooling gas is incorporated in an intermediate space 12 either between the vaporization device 1, 2 or the modulation device 3, 4, or between two elements of the modulation device 3, 4.

a method which is characterized in that, a condensate of the vapor which is deposited on the heat transfer surfaces of the modulation device 3, 4 at the second modulation temperature is vaporized at a modulation temperature corresponding to the vaporization temperature.

a method which is characterized in that, the mass flow rate of the vapor is adjusted by a temperature of the modulation device 3, 4 regulated by a regulator 31, in particular by controlling the heating power of a heating device of the modulation device 3, 4 and/or by the mass flow of a cooling gas into the modulation device 3, 4.

a device which is characterized by a modulation device 3, 4 arranged after the vaporization device 1, 2 in the flow direction, having second heat transfer surfaces, wherein the second heat transfer surfaces are adjusted to a modulation temperature, at least in some regions, wherein the modulation temperature can include at least the value of a condensation temperature at which the vapor condenses on the second heat transfer surface, and the value of the vaporization temperature.

a device or a method which are characterized in that the heat transfer surfaces are formed by the surfaces of walls of open-pored cells of a foam body, it being provided in particular that the foam body is composed of electrically conductive material and can be heated by passing an electrical current through it, has a porosity of 500 to 200, preferably 100 pores per inch, and/or the proportion of all open areas on the surface of the foam body is greater than 90%.

a device or a method which are characterized by a supply pipe 14 for feeding a cooling gas into the modulation device 3, 4 to lower the modulation temperature.

a device or a method which are characterized in that the vaporization device 1, 2 and/or the modulation device 3, 4 each comprise two porous foam bodies arranged one after the other in the flow direction, wherein it is provided in particular that in the vaporization device 1, an upstream foam body is a pre-heating device for the carrier gas and is spaced apart from a second foam body of the vaporization device 2 by an intermediate space 10, in which intermediate space an aerosol supply pipe 9 feeds to supply an aerosol comprising the particles, and/or wherein it is provided in particular that the two foam bodies of the modulation device 3, 4 arranged one after the other in the flow direction are separated from each other by an intermediate space 12, into which a coolant gas supply line 14 feeds to introduce the cooling gas.

a device or a method which are characterized in that four substantially identically designed foam bodies 1, 2, 3, 4 are arranged one after the other in the flow direction in an evaporator housing, wherein the walls of said housing 7, arranged downstream of the modulation device 3, 4 are heated to a temperature which is above the vaporization temperature.

a device or a method, which are characterized by a sensor 29 arranged downstream of the modulation device 3, 4, for measuring the partial pressure or concentration of the vapor in the carrier gas.

a device or a method, which are characterized in that the device is part of a CVD or PVD reactor comprising a gas inlet body 24 and a susceptor 25, wherein the vapor transported by the carrier gas through the gas inlet body is transported towards a substrate 26 placed on the susceptor 25, where it condenses due to a chemical reaction or a temperature decrease, wherein in particular a vacuum pump 28 is provided in order to evacuate the interior of the CVD or PVD reactor.

All disclosed features (individually, but also in combination with each other) are essential to the invention. The disclosure of the application hereby also incorporates the disclosed content of the associated/attached priority documents (copy of the preliminary application) in full, including for the purpose of incorporating features of those documents into claims of the present application. The dependent claims with their features characterize independent inventive extensions of the prior art, in particular for making partial applications on the basis of these claims.

LIST OF REFERENCE NUMERALS 1 pre-heating device
2 vaporization device
3 modulation device
4 modulation device
5 housing
6 outlet channel
7 conical surface, housing wall
8 cylindrical section, housing wall
9 aerosol supply pipe
9' opening
10 intermediate space
11 intermediate space
12 intermediate space
13 carrier gas supply pipe
14 cooling gas supply pipe
15 electrical supply line
15' contact
16 electrical supply line
16' contact
17 electrical supply line
17' contact
18 electrical supply line
18' contact
19 aerosol generator
20 mass flow controller, regulator
21 heating device
22 mass flow controller, regulator
23 temperature control device
24 gas inlet body, gas outlet body
25 susceptor
26 substrate
27 reactor housing
28 vacuum pump
29 sensor
30 mass flow controller, regulator
31 regulator

What is claimed is:

1. A method for generating a vapor for a chemical vapor deposition (CVD) or physical vapor deposition (PVD) device, the method comprising:
vaporizing, in a single or multistage vaporization device (1, 2), solid or liquid particles into a vapor, wherein the particles are vaporized by bringing the particles into contact with a first heat transfer surface that has reached a vaporization temperature;
transporting by a carrier gas the vapor out of the vaporization device (1, 2) in a flow direction of the carrier gas; and
transporting by the carrier gas the vapor through a single or multistage modulation device (3, 4) which is arranged after the vaporization device (1, 2) in the flow direction,
wherein in a vapor transfer phase, second heat transfer surfaces of the modulation device (3, 4) are adjusted to a first modulation temperature at which the vapor passes through the modulation device (3, 4) without condensing in a material-cumulative manner on the second heat transfer surfaces, and in an intermission phase, the second heat transfer surfaces are cooled to a second modulation temperature at which at least a portion of the vapor condenses in a material-cumulative manner on the second heat transfer surfaces, and
wherein the modulation device (3, 4) is cooled to the second modulation temperature by introducing a cooling gas.

2. The method of claim 1, wherein subsequent to a condensate of the vapor being deposited on the second heat transfer surfaces of the modulation device (3, 4) at the second modulation temperature, the condensate is vaporized at the vaporization temperature, thereby reducing material accumulation of the condensate.

3. The method of claim 1, further comprising adjusting a mass flow rate of the vapor by regulating a temperature of the modulation device (3, 4) with a regulator (31), wherein the temperature of the modulation device (3, 4) is regulated by performing one or more of controlling a heating power of a heating device of the modulation device (3, 4) and controlling a mass flow rate of a cooling gas which is introduced into the modulation device (3, 4).

4. The method of claim 1, wherein the cooling gas is introduced into an intermediate space (12) either between the vaporization device (1, 2) and the modulation device (3, 4), or between two elements of the modulation device (3, 4).

5. The method of claim 1, further comprising:
transporting the vapor from the modulation device (3, 4) through a gas inlet body (24) of the CVD or PVD device;
transporting the vapor from the gas inlet body (24) towards a substrate (26) disposed on a susceptor (25) of the CVD or PVD device, on which the vapor condenses due to a chemical reaction or a temperature decrease; and
evacuating, by a vacuum pump (28), an interior of the CVD or PVD device.

6. An apparatus for generating a vapor for a chemical vapor deposition (CVD) or physical vapor deposition (PVD) device, the apparatus comprising:
a single or multistage vaporization device (1, 2) with a first heat transfer surface that is configured to, when heated to a vaporization temperature, vaporize solid or liquid particles, wherein the vapor generated by vaporization of the particles is transported out of the vaporization device (1, 2) by a carrier gas in a flow direction of the carrier gas;
a single or multistage modulation device (3, 4), arranged after the vaporization device (1, 2) in the flow direction, having second heat transfer surfaces that are adjusted to a first modulation temperature at which the vapor passes through the modulation device (3, 4) without condensing in a material-cumulative manner on the second heat transfer surfaces, and a second modulation temperature at which at least a portion of the vapor condenses in a material-cumulative manner on the second heat transfer surfaces; and a supply pipe (14) for supplying a cooling gas into the modulation device (3, 4).

7. The apparatus of claim 6, wherein the second heat transfer surfaces are formed by surfaces of walls of open-pored cells of a foam body.

8. The apparatus of claim 6, wherein the vaporization device (1, 2) and the modulation device (3, 4) each comprise two open-pored foam bodies arranged one after the other in the flow direction.

9. The apparatus of claim 6, wherein four substantially identically designed foam bodies (1, 2, 3, 4) are arranged one after the other in the flow direction in an evaporator housing, wherein walls (7, 8) of said housing arranged downstream of the modulation device (3, 4) are heated to a temperature which is above the vaporization temperature.

10. The apparatus of claim 6, further comprising a sensor (29), arranged downstream of the modulation device (3, 4), that is configured to measure a partial pressure or concentration of the vapor in the carrier gas.

11. The apparatus of claim 6, further comprising:
    a gas inlet body (24) and a susceptor (25), wherein the vapor transported by the carrier gas through the gas inlet body (24) is transported towards a substrate (26) disposed on the susceptor (25), on which the vapor condenses due to a chemical reaction or a temperature decrease; and
    a vacuum pump (28) configured to evacuate an interior of the CVD or PVD device.

12. The apparatus of claim 7, wherein the foam body is composed of an electrically conductive material that is heated by passing an electrical current through the foam body, wherein the foam body has a porosity of 200 to 500 pores per inch, and/or wherein a proportion of all open areas on a surface of the foam body is greater than 90%.

13. An apparatus for generating a vapor for a chemical vapor deposition (CVD) or physical vapor deposition (PVD) device, the apparatus comprising:
    a single or multistage vaporization device (1, 2) with a first heat transfer surface that is configured to, when heated to a vaporization temperature, vaporize solid or liquid particles, wherein the vapor generated by vaporization of the particles is transported out of the vaporization device (1, 2) by a carrier gas in a flow direction of the carrier gas; and
    a single or multistage modulation device (3, 4), arranged after the vaporization device (1, 2) in the flow direction, having second heat transfer surfaces that are adjusted to a first modulation temperature at which the vapor passes through the modulation device (3, 4) without condensing in a material-cumulative manner on the second heat transfer surfaces, and a second modulation temperature at which at least a portion of the vapor condenses in a material-cumulative manner on the second heat transfer surfaces,
    wherein the vaporization device (1, 2) and the modulation device (3, 4) each comprise two open-pored foam bodies arranged one after the other in the flow direction, and
    wherein a first foam body of the vaporization device (2) is configured as a pre-heating device for the carrier gas and is spaced apart from a second foam body of the vaporization device (2) by an intermediate space (10), the apparatus further comprising an aerosol supply pipe (9) connected to the intermediate space (10), the aerosol supply pipe (9) configured to supply an aerosol comprising the solid or liquid particles into the intermediate space (10).

14. An apparatus for generating a vapor for a chemical vapor deposition (CVD) or physical vapor deposition (PVD) device, the apparatus comprising:
    a single or multistage vaporization device (1, 2) with a first heat transfer surface that is configured to, when heated to a vaporization temperature, vaporize solid or liquid particles, wherein the vapor generated by vaporization of the particles is transported out of the vaporization device (1, 2) by a carrier gas in a flow direction of the carrier gas; and
    a single or multistage modulation device (3, 4), arranged after the vaporization device (1, 2) in the flow direction, having second heat transfer surfaces that are adjusted to a first modulation temperature at which the vapor passes through the modulation device (3, 4) without condensing in a material-cumulative manner on the second heat transfer surfaces, and a second modulation temperature at which at least a portion of the vapor condenses in a material-cumulative manner on the second heat transfer surfaces,
    wherein the vaporization device (1, 2) and the modulation device (3, 4) each comprise two open-pored foam bodies arranged one after the other in the flow direction, and
    wherein the two foam bodies of the modulation device (3, 4) arranged one after the other in the flow direction are separated from each other by an intermediate space (12), the apparatus further comprising a cooling gas supply line (14) connected to the intermediate space (12), the cooling gas supply line (14) configured to introduce a cooling gas into the intermediate space (12).

* * * * *